(12) United States Patent
Goeke

(10) Patent No.: US 9,077,301 B2
(45) Date of Patent: Jul. 7, 2015

(54) NANOVOLT AMPLIFIER DESIGN

(71) Applicant: Keithley Instruments, Inc., Cleveland, OH (US)

(72) Inventor: Wayne C. Goeke, Hudson, OH (US)

(73) Assignee: KEITHLEY INSTRUMENTS, INC., Cleveland, OH (US)

( * ) Notice: Subject to any disclaimer, the term of this patent is extended or adjusted under 35 U.S.C. 154(b) by 82 days.

(21) Appl. No.: 13/906,051

(22) Filed: May 30, 2013

(65) Prior Publication Data
US 2014/0354354 A1    Dec. 4, 2014

(51) Int. Cl.
*H03F 1/02*    (2006.01)
*H03F 3/45*    (2006.01)
*H03F 1/30*    (2006.01)
*H03F 3/38*    (2006.01)

(52) U.S. Cl.
CPC .............. *H03F 3/45* (2013.01); *H03F 3/45475* (2013.01); *H03F 1/303* (2013.01); *H03F 3/38* (2013.01)

(58) Field of Classification Search
USPC ........................................................ 330/9, 69
See application file for complete search history.

(56) References Cited

U.S. PATENT DOCUMENTS

2006/0186954 A1*    8/2006    Koller et al. ...................... 330/9

* cited by examiner

*Primary Examiner* — Khanh V Nguyen
(74) *Attorney, Agent, or Firm* — Marger Johnson & McCollom PC

(57) ABSTRACT

A circuit can include operational amplifier having a first input, a second input, and an output, first and second resistors in series between the output of the op-amp and a ground, and multiple switches configurable to toggle the circuit between a positive phase and a negative phase.

19 Claims, 5 Drawing Sheets

US 9,077,301 B2

NANOVOLT AMPLIFIER DESIGN

BACKGROUND

There are presently two known techniques in which nanovolt-meters may reduce amplifier offset drift. The first technique, generally referred to as the measure zero method and illustrated by FIG. 1, includes a two-phase measurement: a measuring of the input, and a measuring of the circuit common. The difference between the two measurements may be used to remove the offsets of the amplifier A and attenuator and of the measurement circuit, e.g., analog-to-digital converter (ADC).

When the switch 102 is in the first state, e.g., at Hi (as shown), the resulting voltage $V_{OUT\_1}$ is given by the following:

$$V_{OUT\_1} + V_{M_{OS}} = (+V_{IN} + V_{OS} + V_{T1})\left(\frac{R_1 + R_2}{R_1}\right) + V_{M_{OS}}$$

When the switch 102 is in the second state, e.g., at Lo (not shown), the resulting voltage $V_{OUT\_2}$ is given by the following:

$$V_{OUT\_2} + V_{M_{OS}} = (V_{OS} + V_{T1})\left(\frac{R_1 + R_2}{R_1}\right) + V_{M_{OS}}$$

Thus, the measurement voltage $V_{Meas}$ may be determined by the following:

$$V_{Meas} = (V_{OUT\_1} + V_{M_{OS}} - V_{OUT\_2} - V_{M_{OS}}) = V_{IN}\left(\frac{R_1 + R_2}{R_1}\right)$$

The second technique, generally referred to as the chopping method and illustrated by FIG. 2, also includes a two-phase measurement but, in this technique, the differential inputs of the amplifier A and the amplifier's output are reversed, thereby producing two measurements that may be averaged to remove the amplifier's offset.

When the switch 202 is in the first state (as shown), the resulting voltage $V_{OUT\_1}$ is given by the following:

$$V_{OUT\_1} + V_{MOS} = (+V_{IN} + V_{OS} + V_{T1})\left(\frac{R_1 + R_2}{R_1}\right) + V_{MOS}$$

When the switch 202 is toggled (not shown), the resulting voltage $V_{OUT\_2}$ is given by the following:

$$V_{OUT\_2} + V_{MOS} = (+V_{IN} - V_{OS} + V_{T1})\left(\frac{R_1 + R_2}{R_1}\right) + V_{MOS}$$

Thus, the measurement voltage $V_{Meas}$ may be determined by the following:

$$V_{Meas} = \frac{(V_{OUT\_1} + V_{OUT\_2} + 2V_{MOS})}{2} = (V_{IN} + V_{T1})\left(\frac{R_1 + R_2}{R_1}\right) + V_{MOS}$$

Because both measurements in this technique measure the input, the measurement noise is half compared to that of the gain stage illustrated by FIG. 1 but, because the attenuator offset is not removed, care must be taken to insure that the attenuator offset is stable. Also, the measurement circuit offset and noise, such as the ADC, are not removed and, thus, must be removed by other measurement methods.

Accordingly, a need remains for a more stable measurement than provided by present circuits and, more particularly, for rejection of both amplifier offset and attenuator offset while measuring the input signal in both phases.

SUMMARY

Embodiments of the disclosed technology are generally directed to circuits designed to achieve rejection of both the amplifier offset and the attenuator offset while measuring the input signal in both phases.

An amplifier design with two phases: a positive gain & a negative gain. The offsets of the input amplifier, the gain setting attenuator and the measurement circuit sensing the amplifiers output are cancelled out when the difference of two phases is calculated.

A two phase gain stage comprised of a differential gain stage and an attenuator. One phase has the Hi input connected to the positive input of the differential gain stage which is configured as a buffer driving one end of the attenuator and the Lo input connected to a tap on the attenuator with the remaining end of the attenuator connected to circuit common. The other phase has Hi connected to the negative input and Lo connect to the output of the differential gain stage with the output also connected to one end of the attenuator, the positive input connected to an attenuator tap and the remaining end connected to circuit common.

DETAILED DESCRIPTION

Embodiments of the disclosed technology are generally directed to circuits that are designed to achieve rejection of both the amplifier offset and the attenuator offset while measuring the input signal in both phases. Such embodiments generally yield a more stable measurement than that provided by prior art circuits in use today.

Figure 1:
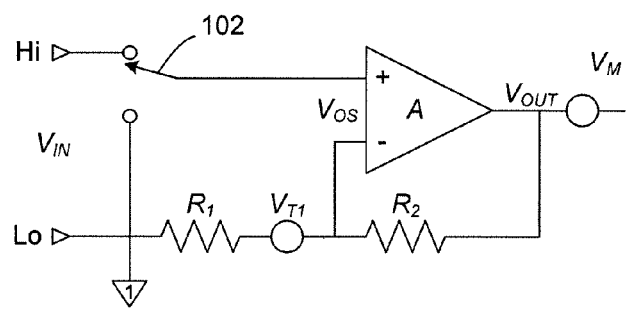
FIG. 1 is a circuit diagram illustrating the gain stage for a first prior attempt at reducing amplifier offset drift in a measurement device.
Figure 2:
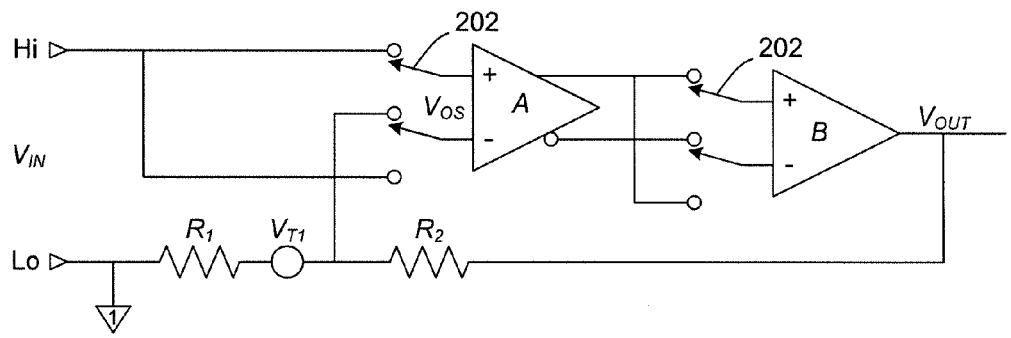
FIG. 2 is a circuit diagram illustrating the gain stage for a second prior attempt at reducing amplifier offset drift in a measurement device.
Figure 3:
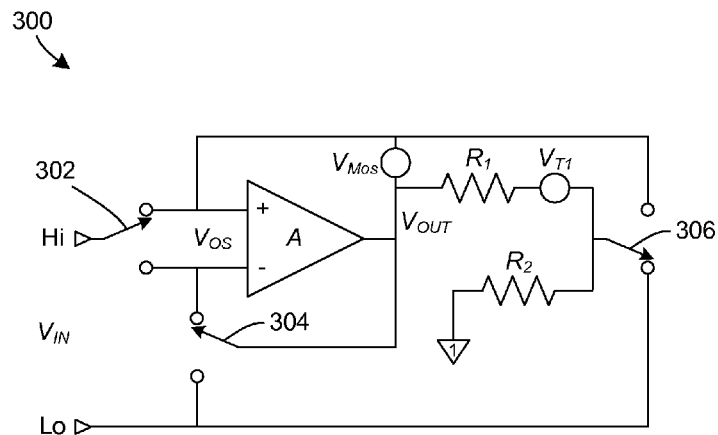
FIG. 3 is a circuit diagram illustrating a first example of an amplifier design in a measurement device in accordance with certain embodiments of the disclosed technology.

FIG. 3 is a circuit diagram 300 illustrating a first example of an amplifier design in a measurement device in accordance with certain embodiments of the disclosed technology. In the example, which includes a single amplifier A and two resistors $R_1$ and $R_2$, a measurement is made using two phases: a positive phase in which the switches 302-306 are as shown, and a negative phase (not shown) in which the switches are toggled.

Toggling the switches 302-306 reverses the input voltage that is applied across $R_1$ while $V_{OS}$ and $V_{T1}$ are not reversed. Averaging the difference of the measurements of $V_{OUT}$ from the two phases generally yields a result in which errors caused by $V_{OS}$, $V_{T1}$ and $V_{Mos}$ are cancelled out. This effectively yields half the signal-to-noise ratio for both the amplifier noise and the measurement circuit noise.

When in the positive phase, the resulting voltage $V_{OUT+}$ is given by the following:

$$V_{OUT+} + V_{MOS} = (+V_{IN} + V_{OS} + V_{T1})\left(\frac{R_1 + R_2}{R_1}\right) + V_{MOS}$$

When in the negative phase, the resulting voltage $V_{OUT-}$ is given by the following:

$$V_{OUT-} + V_{MOS} = (-V_{IN} + V_{OS} + V_{T1})\left(\frac{R_1 + R_2}{R_1}\right) + V_{MOS}$$

Thus, the measurement voltage $V_{Meas}$ may be determined by the following:

$$V_{Meas} = \frac{(V_{OUT+} - V_{OUT-})}{2} = V_{IN}\left(\frac{R_1 + R_2}{R_1}\right)$$

Figure 4:
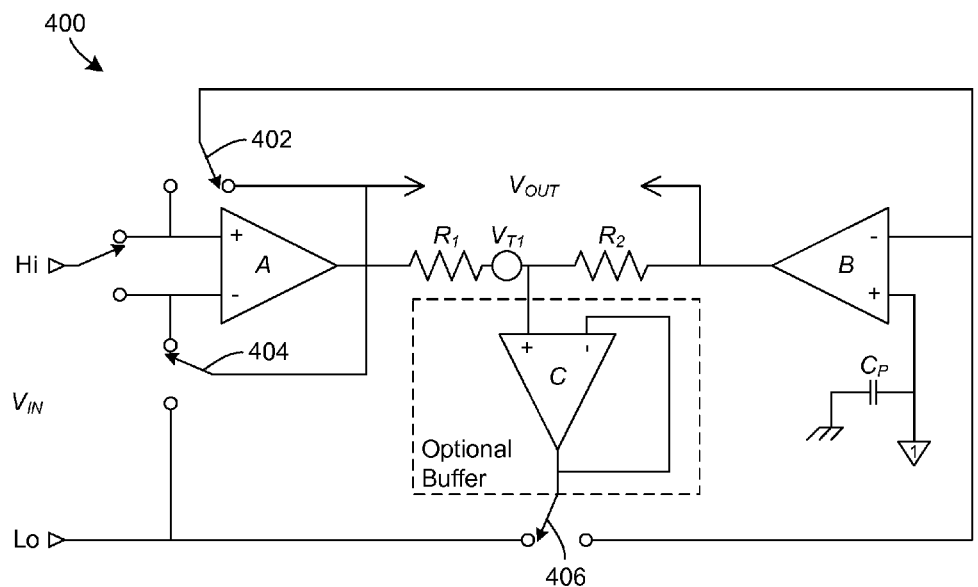
FIG. 4 is a circuit diagram illustrating a second example of an amplifier design in a measurement device in accordance with certain embodiments of the disclosed technology.

FIG. 4 is a circuit diagram 400 illustrating a second example of an amplifier design in a measurement device in accordance with certain embodiments of the disclosed technology. The example illustrated by FIG. 4 is similar to the example illustrated by FIG. 3 except for the addition of an amplifier B, which removes the common mode from the amplifier A without adding any offset errors to voltage $V_{OUT}$, and switches 402-406 instead of 302-306.

Figure 5:
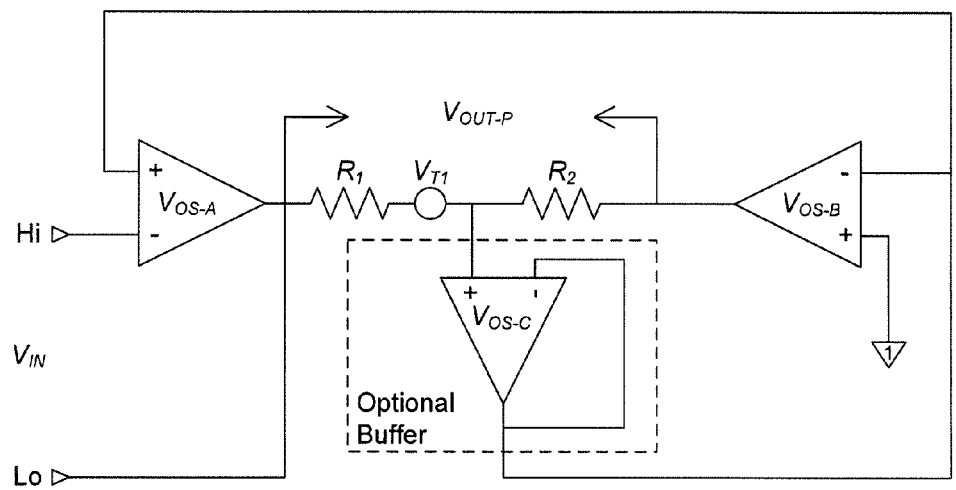
FIG. 5 is a circuit diagram illustrating a positive phase of the amplifier illustrated by FIG. 4.

When the switches 402-406 are positioned such that the circuit is in the positive phase, as illustrated by FIG. 5, the resulting voltage $V_{Meas-P}$ is given by the following:

$$V_{Meas-P} =$$
$$V_{OUT-P} + V_{MOS} = (V_{IN} + V_{OS-A} + V_{OS-C} + V_{T1})\left(\frac{R_1 + R_2}{R_1}\right) + V_{MOS}$$

Figure 6:
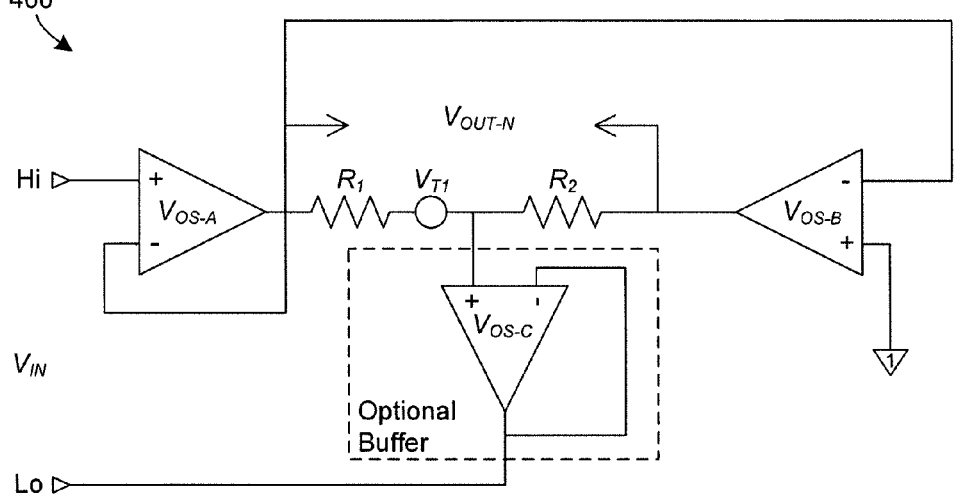
FIG. 6 is a circuit diagram illustrating a negative phase of the amplifier illustrated by FIG. 4.

When the switches 402-406 are toggled such that the circuit is in the negative phase, as illustrated by FIG. 6, the resulting voltage $V_{Meas-N}$ is given by the following:

$$V_{Meas-N} =$$
$$V_{OUT-N} + V_{MOS} = (-V_{IN} + V_{OS-A} + V_{OS-C} + V_{T1})\left(\frac{R_1 + R_2}{R_1}\right) + V_{MOS}$$

Thus, the output voltage $V_{OUT}$ may be determined by the following:

$$V_{OUT} = \frac{1}{2}(V_{OUT-P} + V_{MOS} - V_{OUT-N} - V_{MOS}) = V_{IN}\left(\frac{R_1 + R_2}{R_1}\right)$$

In this configuration, the Lo input, in the positive phase, is connected through the attenuator. Thus, any common mode on the input signal will need to charge the parasitic capacitance $C_P$ from the power supply common to the chassis. This current will flow through $R_1$ during the first phase.

An optional buffer (here, amplifier C) can be added to provide a low impedance path to common. However, the offset voltage and noise voltage of amplifier C is added at the input. The offset voltage is cancelled by the difference of the two phases, and the noise voltage is RMS with the noise voltage of amplifier A. Therefore, the noise quality of the amplifier may be critical to the overall circuit performance. In order to keep the bias current of the input low, amplifier A usually has a JFET input stage. This serves to limit its noise voltage performance to about 2 nV/$\sqrt{Hz}$.

In the example, the input of amplifier C is connected to the attenuator which generally has a low impedance for $R_1$ in order to keep the resistor noise low, e.g., less than 100Ω. The low impedance thus allows amplifier C to be a bipolar input stage. Op-amps having a noise voltage specification of ≤1 nV/$\sqrt{Hz}$ may be used. In certain embodiments where amplifier C is at 1 nV/$\sqrt{Hz}$, about 24% additional noise is added to the circuit if amplifier A has 2 nV/$\sqrt{Hz}$ input noise.

Figure 7:
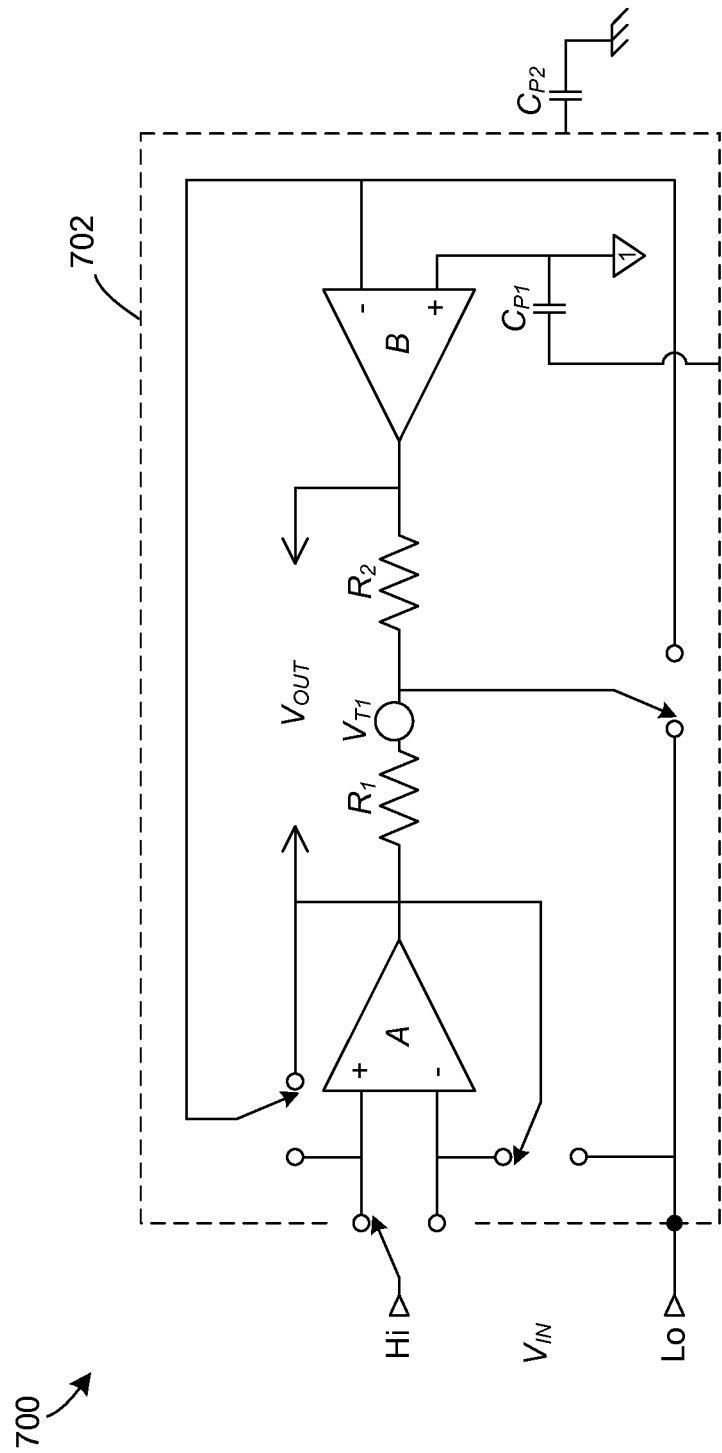
FIG. 7 is a circuit diagram illustrating a third example of an amplifier design in a measurement device in accordance with certain embodiments of the disclosed technology.

FIG. 7 is a circuit diagram 700 illustrating a third example of an amplifier design in a measurement device in accordance with certain embodiments of the disclosed technology. The example illustrated by FIG. 7 is similar to the example illustrated by FIGS. 4-6 except, instead of adding an optional buffer (amplifier C) to the circuit, a Faraday cage (also referred to herein as a guard) 702 is added around the circuit. The guard 702 is connected to the Lo input and divides capacitance $C_{P1}$ such that the circuit ground (ground 1) couples to the guard 702 and the guard 702 couples to the chassis. In this configuration, the common mode on the inputs will only charge capacitance $C_{P2}$ and, consequently, the charge will not flow through $R_1$.

Figure 8:
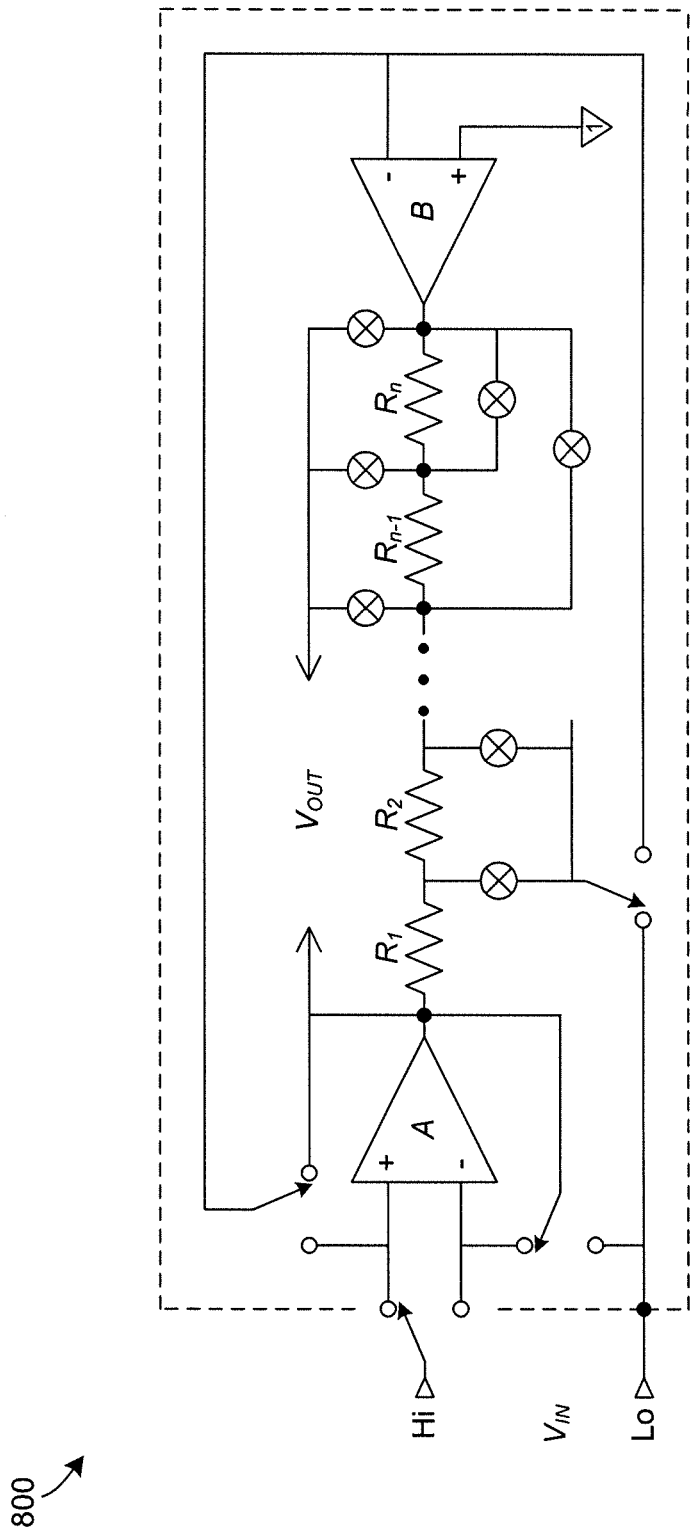
FIG. 8 is a circuit diagram illustrating a fourth example of an amplifier design in a measurement device in accordance with certain embodiments of the disclosed technology.

FIG. 8 is a circuit diagram 800 illustrating a fourth example of an amplifier design in a measurement device in accordance with certain embodiments of the disclosed technology. In this example, the gain can be set by changing the tap node. Alternatively or in addition thereto, a resistor string $R_1$-$R_n$ may be provided between the amplifiers A and B such that resistors may be added to and/or removed from the end of the resistor string $R_1$-$R_n$ depending on any of a number of factors.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated. In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

I claim:

1. A circuit, comprising:
an operational amplifier (op-amp) having a first input (+), a second input (−), and an output having an output voltage $V_{OUT}$, wherein there is an offset voltage $V_{OS}$ between the first and second inputs of the op-amp;
a first resistor $R_1$ having a first end electrically coupled to the output of the op-amp and a second end;
a second resistor $R_2$ electrically coupled between the second end of the first resistor and a ground;
a first switch having a first position in which the first input (+) of the op-amp is electrically coupled to a first input source (Hi) and a second position in which the second input (−) of the op-amp is electrically coupled to the first input source (Hi);
a second switch having a first position in which the output of the op-amp is electrically coupled to the second input (−) of the op-amp and a second position in which the output of the op-amp is electrically coupled to a second input source (Lo); and
a third switch having a first position in which the second input source (Lo) is electrically coupled to the second end of the first resistor and a second position in which the first input source (Hi) is electrically coupled to the second end of the first resistor, wherein there is an input voltage $V_{IN}$ between the first and second input sources, and wherein there is a thermal voltage ($V_{T1}$) at the second end of the first resistor.

2. The circuit of claim 1, wherein the circuit is in a positive phase when each of the first, second, and third switches is in the first position.

3. The circuit of claim 2, wherein the output voltage $V_{OUT}$ is $V_{OUT+}$ when the circuit is in the positive phase, and further wherein a sum of the output voltage $V_{OUT+}$ and a measured offset voltage $V_{Mos}$ is determined by the following:

$$V_{OUT+} + V_{MOS} = (+V_{IN} + V_{OS} + V_{T_1})\left(\frac{R_1 + R_2}{R_1}\right) + V_{MOS}.$$

4. The circuit of claim 3, wherein the circuit is in a negative phase when each of the first, second, and third switches is in the second position.

5. The circuit of claim 4, wherein the output voltage $V_{OUT}$ is $V_{OUT-}$ when the circuit is in the negative phase, and further wherein a sum of the output voltage $V_{OUT-}$ and the measured offset voltage $V_{Mos}$ is determined by the following:

$$V_{OUT-} + V_{MOS} = (-V_{IN} + V_{OS} + V_{T_1})\left(\frac{R_1 + R_2}{R_1}\right) + V_{MOS}$$

6. The circuit of claim 5, wherein a measurement voltage $V_{Meas}$ may be determined by the following:

$$V_{Meas} = \frac{(V_{OUT+} - V_{OUT-})}{2} = V_{IN}\left(\frac{R_1 + R_2}{R_1}\right)$$

7. A circuit, comprising:
a first operational amplifier (op-amp) having a first input (+), a second input (−), and an output, wherein there is a first offset voltage $V_{OS-A}$ between the first and second inputs of the first op-amp;
a first resistor $R_1$ having a first end electrically coupled to the output of the op-amp and a second end;
a second op-amp having a first input electrically coupled to a ground, a second input (−), and an output, wherein there is a second offset voltage $V_{OS-B}$ between the first and second inputs of the second op-amp;
a second resistor $R_2$ electrically coupled between the second end of the first resistor and the output of the second op-amp;
a first switch having a first position in which the first input (+) of the first op-amp is electrically coupled to a first input source (Hi) and a second position in which the second input (−) of the first op-amp is electrically coupled to the first input source (Hi);
a second switch having a first position in which the output of the first op-amp is electrically coupled to the second input (−) of the second op-amp and a second position in which the second input (−) of the second op-amp is electrically coupled to the first input source (Hi); and
a third switch having a first position in which the second end of the first resistor is electrically coupled to the second input source (Lo) and a second position in which the second end of the first resistor is electrically coupled to the second input (−) of the second op-amp, wherein there is an input voltage $V_{IN}$ between the first and second input sources, wherein there is a thermal voltage ($V_{T1}$) at the second end of the first resistor, and further wherein there is an output voltage $V_{OUT}$ between the outputs of the first and second op-amps.

8. The circuit of claim 7, wherein the circuit is in a positive phase when each of the first, second, and third switches is in the second position.

9. The circuit of claim 7, further comprising a capacitance between the first input of the second op-amp and a chassis.

10. The circuit of claim 7, further comprising a guard around the circuit.

11. The circuit of claim 10, wherein the guard is a Faraday cage.

12. The circuit of claim 10, further comprising a capacitance between the guard and a chassis.

13. The circuit of claim 7, further comprising at least one additional resistor electrically positioned between the first and second resistors.

14. The circuit of claim 13, further comprising a guard around the circuit.

15. The circuit of claim 8, further comprising a third op-amp electrically coupled to the second end of the first resistor, a second input, and an output, wherein there is a third offset voltage $V_{OS-C}$ between the first and second inputs of the third op-amp.

16. The circuit of claim 15, wherein the output voltage $V_{OUT}$ is $V_{OUT-P}$ when the circuit is in the positive phase, and further wherein a sum of the output voltage $V_{OUT-P}$ and a measured offset voltage $V_{Mos}$ is determined by the following:

$$V_{Meas-P} =$$
$$V_{OUT-P} + V_{MOS} = (V_{IN} + V_{OS-A} + V_{OS-C} + V_{T1})\left(\frac{R_1 + R_2}{R_1}\right) + V_{MOS}$$

17. The circuit of claim 16, wherein the circuit is in a negative phase when each of the first, second, and third switches is in the first position.

18. The circuit of claim 17, wherein the output voltage $V_{OUT}$ is $V_{OUT-N}$ when the circuit is in the negative phase, and further wherein a sum of the output voltage $V_{OUT-N}$ and the measured offset voltage $V_{Mos}$ is determined by the following:

$$V_{Meas-N} =$$
$$V_{OUT-N} + V_{MOS} = (-V_{IN} + V_{OS-A} + V_{OS-C} + V_{T1})\left(\frac{R_1 + R_2}{R_1}\right) + V_{MOS}$$

19. The circuit of claim 18, wherein the resulting output voltage $V_{OUT}$ may be determined by the following:

$$V_{OUT} = \frac{1}{2}(V_{OUT-P} + V_{MOS} - V_{OUT-N} - V_{MOS}) = V_{IN}\left(\frac{R_1 + R_2}{R_1}\right).$$

* * * * *